United States Patent
Kelty (10) Patent No.: US 9,313,925 B2
(45) Date of Patent: Apr. 12, 2016

(54) PLUGGABLE MODULE HOUSING ASSEMBLY

(71) Applicant: Infinera Corp., Annapolis Junction, MD (US)

(72) Inventor: Matthew Kelty, Cambria, CA (US)

(73) Assignee: Infinera Corporation, Sunnyvale, CA (US)

( * ) Notice: Subject to any disclaimer, the term of this patent is extended or adjusted under 35 U.S.C. 154(b) by 250 days.

(21) Appl. No.: 14/041,781

(22) Filed: Sep. 30, 2013

(65) Prior Publication Data

US 2015/0092354 A1    Apr. 2, 2015

(51) Int. Cl.
H05K 7/10     (2006.01)
H05K 7/14     (2006.01)
H05K 7/20     (2006.01)

(52) U.S. Cl.
CPC .................................. *H05K 7/20563* (2013.01)

(58) Field of Classification Search
None
See application file for complete search history.

(56) References Cited

U.S. PATENT DOCUMENTS

| | | | | |
|---|---|---|---|---|
| 8,081,470 | B2* | 12/2011 | Oki et al. | 361/715 |
| 8,879,267 | B2* | 11/2014 | Henry et al. | 361/715 |
| 8,911,244 | B2* | 12/2014 | Elison et al. | 439/137 |
| 2003/0161108 | A1* | 8/2003 | Bright et al. | 361/707 |
| 2003/0169983 | A1* | 9/2003 | Branch et al. | 385/92 |
| 2005/0220425 | A1* | 10/2005 | Kropp et al. | 385/88 |
| 2006/0176666 | A1* | 8/2006 | Saturley et al. | 361/687 |
| 2009/0296351 | A1* | 12/2009 | Oki et al. | 361/709 |
| 2011/0044006 | A1* | 2/2011 | Kim | 361/715 |
| 2012/0300407 | A1* | 11/2012 | Yamamoto | 361/715 |

* cited by examiner

Primary Examiner — Courtney Smith
(74) Attorney, Agent, or Firm — Dunlap Codding P.C.; David L. Soltz (57) ABSTRACT

A pluggable module housing assembly comprises a base at least partially surrounding a socket having an entrance sized and dimensioned to receive a pluggable module. At least one guide extends adjacent to the socket. A heat sink assembly includes a riding heat sink having a module-contacting surface facing the socket, and an actuating assembly coupled to the base and to the riding heat sink. The actuating assembly is configured to move the riding heat sink relative to the base between a deployed position a first distance from the at least one guide, and a stowed position a second distance from the at least one guide, the second distance being greater than the first distance.

11 Claims, 8 Drawing Sheets

PLUGGABLE MODULE HOUSING ASSEMBLY

BACKGROUND

1. Field of Inventive Concepts

The inventive concepts disclosed herein are generally directed to pluggable module housing assemblies. More particularly, but not by way of limitation, the inventive concepts disclosed herein are directed to pluggable module housing assemblies including riding heat sinks configured to be moved so as to avoid contacting a pluggable module during insertion of the pluggable module into a pluggable module housing and moved into contact with the pluggable module so as to form a thermal interface with the pluggable module once the pluggable module is inserted in the pluggable module housing.

2. Brief Description of Prior Art

Circuit packs including pluggable module housings are deployed in various networks and are configured to allow for the hot insertion (e.g., insertion in the field without disassembling the circuit pack) of a variety of pluggable modules, such as transceivers, optical modules, XFP modules, SFP+ modules, or CFP modules, for example. Pluggable modules are generally plugged in or inserted into a pluggable module housing by sliding or otherwise inserting the module into the housing. Several industry standards have been developed to standardize pluggable module housings and to set insertion force requirements for pluggable modules.

Heat generated by pluggable modules during operations is typically dissipated by one or more heat exchangers or heat sinks thermally coupled with the pluggable modules and/or with the pluggable module housings.

Recently, riding heat sinks have been incorporated into pluggable module housings by being mounted, clamped, or otherwise positioned into the pluggable module housing so that a large thermal interface is formed between contact surfaces of the riding heat sink and a pluggable module inserted in the pluggable module housing, and so that a predetermined amount of clamping force is exerted by the riding heat sink on the pluggable module at the thermal interface. Typically, as the pluggable module is inserted into the housing, a contact surface of the pluggable module presses against and slides under a module-contacting surface of the riding heat sink, which results in the module-contacting surface of the heat sink and the contact surface of the pluggable module sliding over one another each time a pluggable module is inserted into, or removed from, the housing.

Friction between the surfaces of riding heat sinks and pluggable modules results in a certain amount of insertion force being used to insert the pluggable module into the pluggable module housing. The amount of insertion force used to insert or remove a pluggable module is regulated by industry standards designed to prevent damage to the pluggable module housing, the riding heat sink, and the pluggable module. For example, currently applicable multi-source agreement (MSA) standards call for a pluggable module to be inserted into a pluggable module housing with a maximum insertion force of eighteen pounds (or 80 N), which effectively limits the clamping force at the thermal interface between the riding heat sink and the pluggable module to about three pounds or less.

Factors affecting the thermal efficiency of the riding heat sink include the smoothness or roughness of the contact surfaces forming the thermal interface between the heat sink and the pluggable module, and the clamping force exerted on the thermal interface. The applicable maximum insertion force standard is one practical limitation of the thermal efficiency of existing pluggable module housings having riding heat sinks. Another limitation arises from the possibility of contact surface damage due to repeated insertions and removals of pluggable modules in the housing. The contact surface of the riding heat sink and/or the contact surface of the pluggable module may become scratched, gouged, or otherwise roughened or damaged due to abrasion of the surfaces as a result of the surfaces rubbing against one another each time a pluggable module is inserted or removed.

To that end, what is need is a pluggable module housing assembly which allows insertion of the pluggable module into the pluggable module housing with a minimal amount of force, and which has a riding heat sink with an optimal thermal efficiency. It is to such an improved pluggable module housing assembly that embodiments of the present disclosure are directed.

SUMMARY

In one aspect, the inventive concepts disclosed herein are directed to a pluggable module housing assembly. The pluggable module housing assembly includes a base at least partially surrounding a socket having an entrance sized and dimensioned to receive a pluggable module. In one version, the base includes a first side and a second side, the first side and the second side spaced apart to define the socket and the first and second sides having first ends located at an entrance of the socket. At least one guide extends adjacent to the socket. A heat sink assembly includes a riding heat sink having a module-contacting surface facing the socket, and an actuating assembly coupled to the base and to the riding heat sink, the actuating assembly configured to move the riding heat sink relative to the base between a deployed position a first distance from the at least one guide, and a stowed position a second distance from the at least one guide, the second distance being greater than the first distance.

In a further aspect, the inventive concepts disclosed herein are directed to a circuit pack, including a support and a pluggable module housing assembly coupled with the support. The pluggable module housing assembly has a base at least partially surrounding a socket having an entrance sized and dimensioned to receive a pluggable module. In one embodiment, the base includes a first side and a second side, the first side and the second side spaced apart to define the socket and having first ends located at an entrance of the socket. The pluggable module housing assembly includes at least one guide extends adjacent to the socket. A heat sink assembly includes a riding heat sink having a module-contacting surface facing the socket and an actuating assembly coupled to the base and to the riding heat sink, the actuating assembly configured to move the riding heat sink relative to the base between a deployed position a first distance from the at least one guide, and a stowed position a second distance from the at least one guide, the second distance being greater than the first distance.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION OF EXEMPLARY EMBODIMENTS

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Embodiments of the inventive concepts disclosed herein are directed to pluggable module housing assemblies including a pluggable module housing configured to receive a pluggable module and coupled to a movable riding heat sink configured to be moved between a stowed position so that the riding heat sink does not come into contact with the pluggable module as the pluggable module is being inserted into the housing, and a deployed position so that the riding heat sink rides onto and is thermally coupled with a pluggable module subsequently to the pluggable module being positioned in the housing.

In some embodiments, the riding heat sink may be moved between the stowed position and the deployed position by an actuating mechanism coupled with the housing and configured such that a portion (e.g., a lever or a handle) of the actuating mechanism at least partially obstructs an opening or an entrance of a module-insertion socket or port of the housing when the riding heat sink is in the deployed position, and is moved (e.g., rotated, retracted, or pivoted) so as to clear (or no longer obstruct) the entrance of the module-insertion socket or port of the housing when the riding heat sink is in the stowed position.

Figure 1:
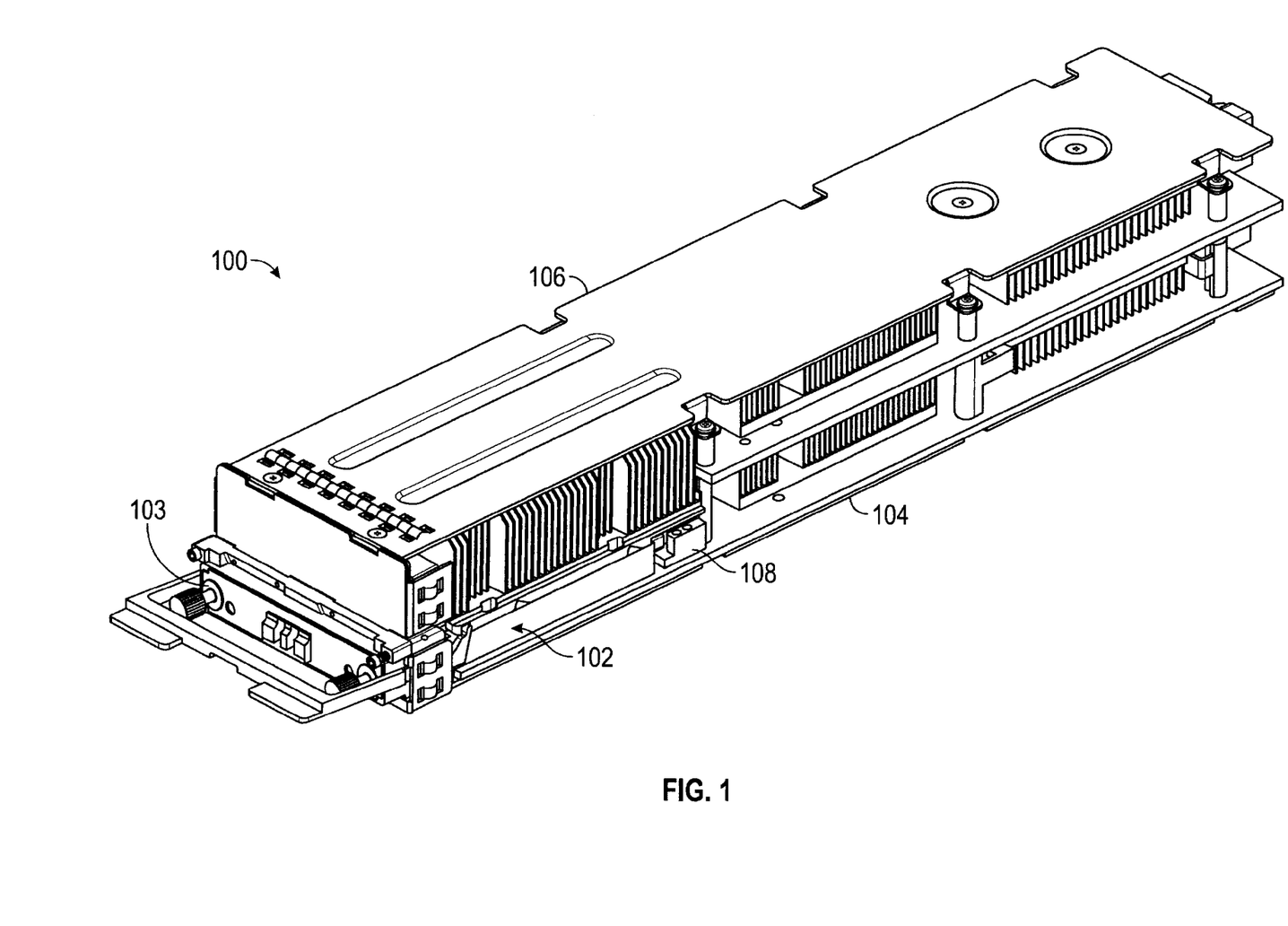
FIG. 1 is a perspective view of a circuit pack including a pluggable module housing assembly with a pluggable module shown inserted therein according to an embodiment of the inventive concepts disclosed herein.
Figure 2:
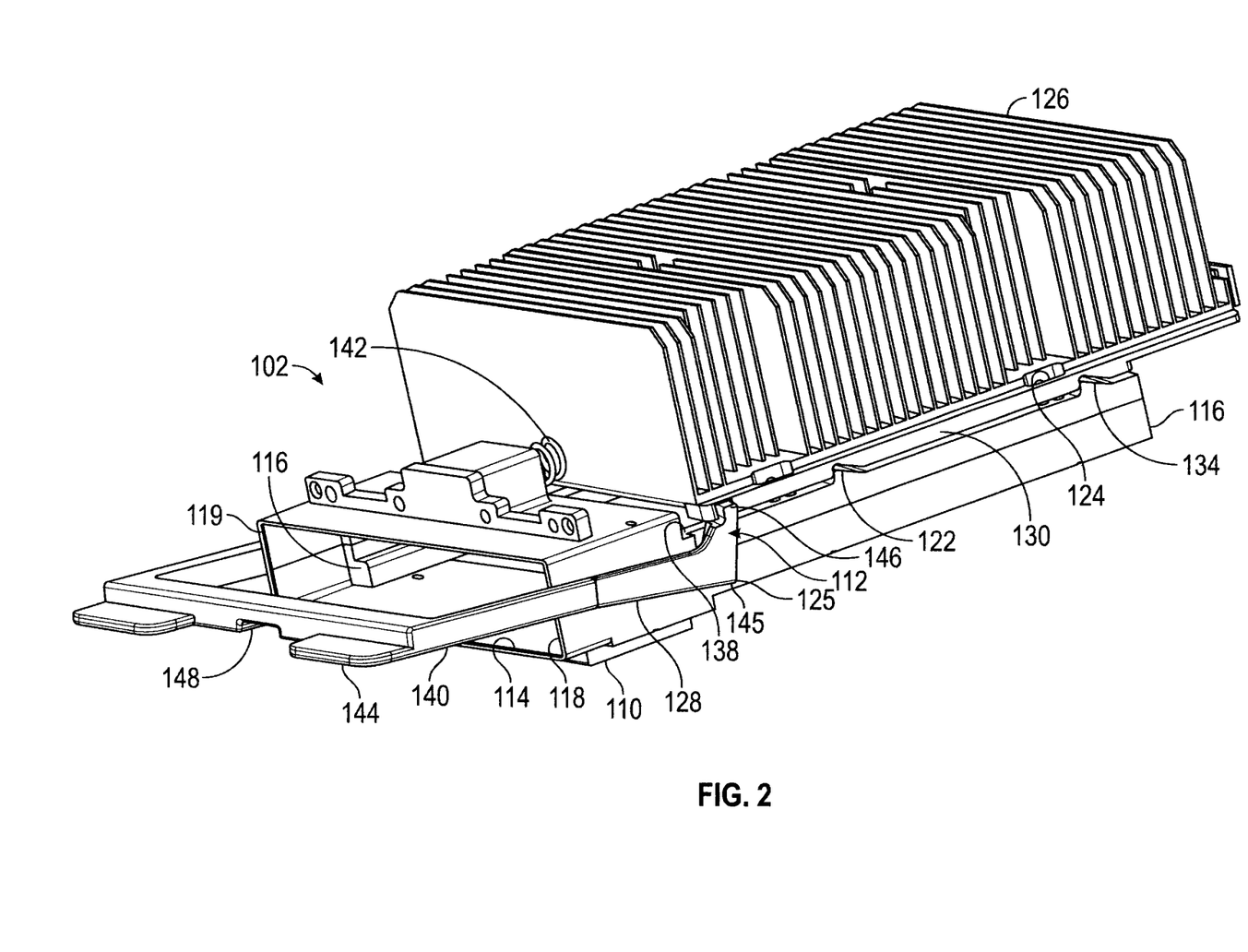
FIG. 2 is a perspective view of an embodiment of a pluggable module housing assembly according to the inventive concepts disclosed herein.

Referring now to the drawings, and to FIGS. 1-2 in particular, shown there is a circuit pack 100 including a pluggable module housing assembly 102 according to an embodiment of the inventive concepts disclosed herein. A pluggable module 103 is shown positioned in the pluggable module housing assembly 102. The pluggable module 103 may be implemented as an optical module, and optical transceiver, a XFP module, a SFP+ module, or CFP module, for example.

The circuit pack 100 may be implemented as an optical transceiver host system or any other desired telecommunications device or equipment and may include a variety of circuitry, processors, processor-readable memory, power sources, heat sinks, printed circuit boards, field programmable gate arrays, application-specific integrated circuits, resistors, capacitors, impact connectors, and one or more pluggable modules 103. The circuit pack 100 includes a support 104, a cover 106, and a variety of circuitry and connectors, such as a pluggable module connector 108, for example, positioned between the support 104 and the cover 106. As will be appreciated by persons of ordinary skill in the art, two or more circuit packs 100 may be assembled into an optical transport network (OTN) Tributary Module.

Figure 3:
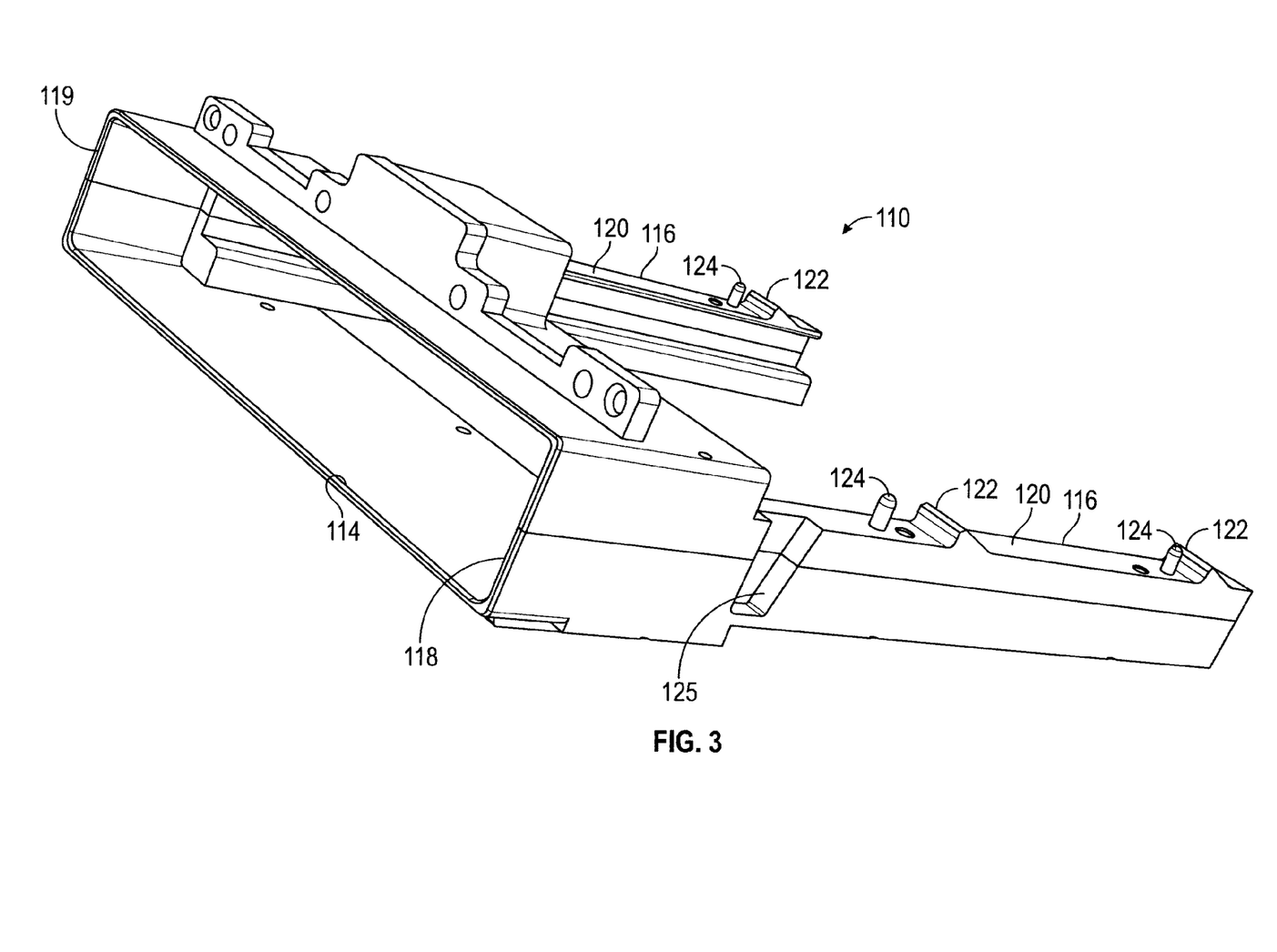
FIG. 3 is a perspective view of an embodiment of a base of the pluggable module housing assembly of FIG. 2.
Figure 4:
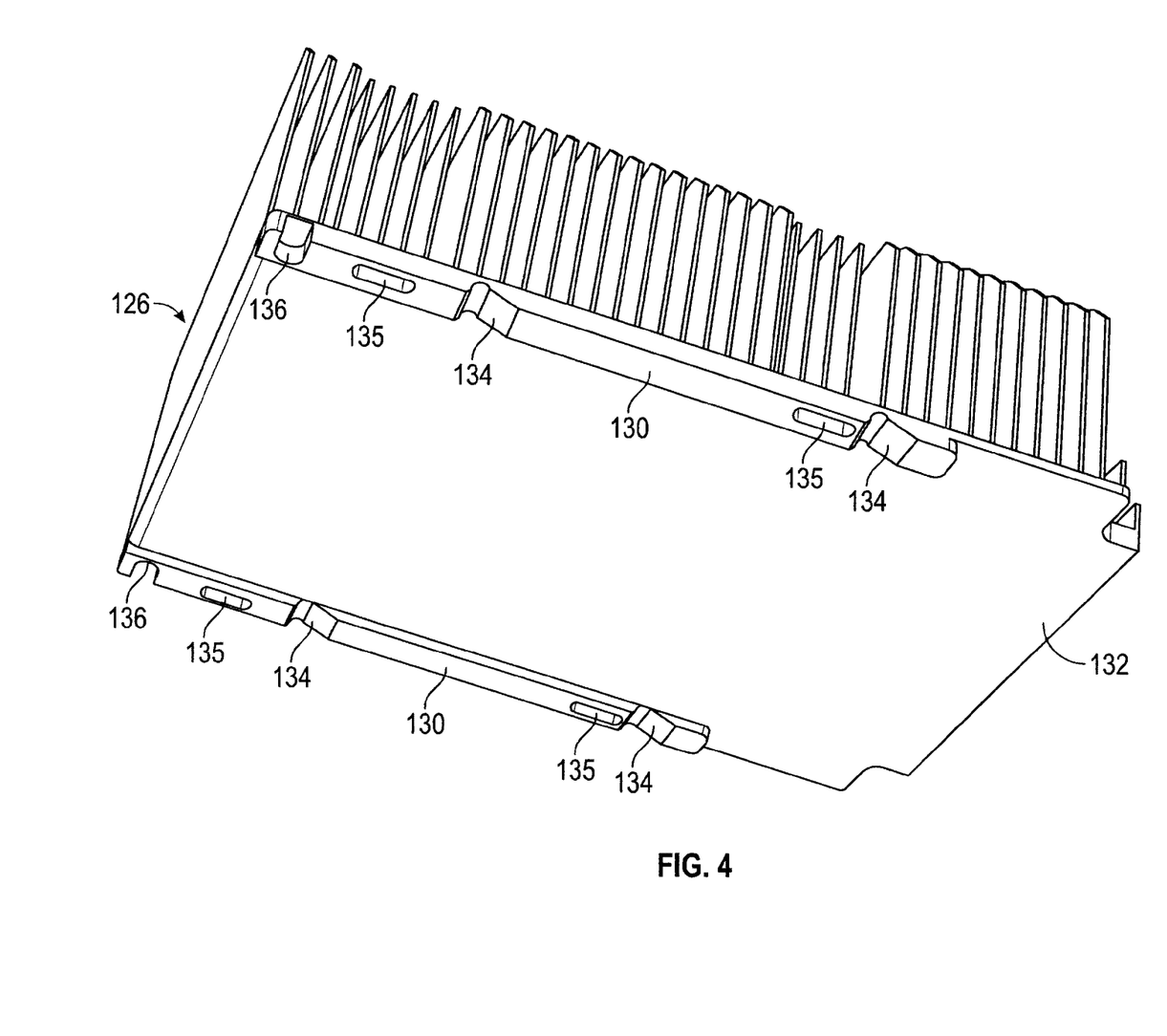
FIG. 4 is a perspective view of an embodiment of a riding heat sink of the pluggable module housing assembly of FIG. 2.

Referring now to FIGS. 2-4, an embodiment of the pluggable module housing assembly 102 includes a base 110 and a heat sink assembly 112.

The base 110 includes a socket 114 and a pair of guides 116 extending into the socket 114. The base 110 may be constructed of an electrically-conductive material such as metals, alloys, and may be used as electrical grounding for a pluggable module, such as the pluggable module 103, inserted therein. In some embodiments, the base 110 may include an upper portion and a lower portion associated with one another in any desirable manner, such as via welds, seams, joints, brackets, fasteners, brackets, clamps, adhesives, or combinations thereof, while in some embodiments the base 110 may be formed as a unitary component or body. In some embodiments, forming the base 110 as a unitary component such as via die-casting, 3D-printing, molding, or machining, may allow for precise alignment of the socket 114 and the guides 116 with one another, for example, to enhance contact between the base 110 and the pluggable module 103 so as to optimize the electrical grounding of the pluggable module 103, to ensure effortless insertion and removal of the pluggable module 103, and to provide optimal alignment of the pluggable module 103 with the pluggable module connector 108.

The base 110 has a first side 118 and a second side 119 spaced apart from one another so as to define an opening or an entrance of the socket 114 such that the socket 114 is configured to receive the pluggable module 103 therein as will be described below. The entrance and/or the socket 114 may have any desired size, shape, and cross-section, as will be appreciated by persons of ordinary skill in the art having the benefit of the instant disclosure.

At least one guide 116, or a pair of guides 116, may be implemented as guiderails configured to guide the pluggable module 103 as the pluggable module 103 is being inserted in the pluggable module housing assembly 102. The first guide 116 may have a first end associated with the first side 118 of the socket 114 and a second end extending into the socket 114. Similarly, the second guide 116 may have a first end associated with the second side 119 of the socket 114 and a second end extending into the socket 114. The guides 116 may be spaced at a distance from one another and may be oriented substantially parallel to one another in some embodiments. In some embodiments, a single guide 116, at least one guide 116, or a plurality of guides 116 (e.g., more than two) may be implemented. Further, in some embodiments the guides 116 may be omitted.

The guides 116 and the socket 114 may be formed as a unitary component in some embodiments, or may be associated with one another in any desired manner such as by seams, joints, brackets, press-fitting, adhesives, clamps, or combinations thereof.

Referring now to FIG. 3, in some embodiments, the guides 116 may include heat sink engaging surfaces 120. The heat sink engaging surfaces 120 may have two or more ramp portions 122. In some embodiments, the ramp portions 122 may be inclined upward (e.g., at an angle varying between 0° and about 60°) in a direction from the second ends toward the first ends of the guides 116. In some embodiments, the ramp portions 122 may be inclined upward in a direction from the first ends toward the second ends of the guides 116, for example. In some embodiments a single ramp portion 122 may be implemented with at least one of the guides 116, while in some embodiments the ramp portions 122 may be omitted. Further, in some embodiments the ramp portions 122 may be replaced with two or more notches recessed or otherwise formed into the heat sink engaging surfaces 120, as will be appreciated by a person of ordinary skill in the art having the benefit of the instant disclosure.

In some embodiments, the heat sink engaging surfaces 120 of guides 116 may include one or more heat sink pins 124 extending therefrom (e.g., substantially vertically or at any desired angle). In some embodiments each of the guides 116 may include two heat sink pins 124 spaced along the respective heat sink engaging surfaces 120, but it is to be understood that in some embodiments the guides 116 may include a single or multiple heat sink pins 124, and in some embodiments the heat sink pins 124 may be omitted.

In some embodiments, at least one of the guides 116 may include a fulcrum notch 125 formed therein adjacent to the socket 114. The fulcrum notch 125 may be configured to receive at a portion of the heat sink assembly 112 therein as will be described below.

The heat sink assembly 112 may include a riding heat sink 126 and an actuating assembly 128.

As shown in FIG. 4, the riding heat sink 126 may have a pair of supports 130 and a module-contacting surface 132. The riding heat sink 126 may be implemented as any desired passive or active heat exchanger configured to dissipate heat from a pluggable module such as the pluggable module 103. In some embodiments, the riding heat sink 126 may include a plurality of fins configured to dissipate heat in a surrounding medium, such as air, for example. The riding heat sink 126 may be constructed of any suitable heat-conducting material, such as metals, alloys, aluminum, or combinations thereof, for example.

The supports 130 may be sized, oriented, and configured to correspond to the guides 116, such that the supports 130 may cooperate with the guides 116 so as to support the riding heat sink 126.

In some embodiments, the supports 130 may include one or more ramp notches 134 formed therein. The ramp notches 134 may be configured to matingly receive the ramp portions 122 therein such that when the riding heat sink 126 is moved so that the supports 130 move laterally over the guides 116, the ramp notches 134 and the ramp portions 122 interact with one another to cause the riding heat sink 126 to move vertically relative to the guides 116 between a first height and a second height. For example, the riding heat sink 126 may move between a deployed position and a stowed position. When the riding heat sink 126 is in the deployed position, the ramp portions 122 may be substantially completely received in the ramp notches 134 so that the supports 130 rest on the heat sink engaging surfaces 120 of the guides 116. Further, when the riding heat sink 126 is moved to the stowed position, the supports 130 may be separated at a distance (e.g., about 0.27 inches) above the heat sink engaging surfaces 120, and the ramp portions 122 may at least partially support the riding heat sink 126 above the guides 116. As will be appreciated by persons of ordinary skill in the art, in some embodiments the ramp notches 134 may be omitted and the riding heat sink 126 may be moved between the stowed position and the deployed position via any suitable mechanisms, features, or means, such as hinges, springs, actuators, levers, lifters, or combinations thereof.

The supports 130 may also include one or more elongated slots 135 configured to receive the heat sink pins 124 therein such that the heat sink pins 124 may slide or otherwise move in the elongated slots 135 in a substantially longitudinal and in substantially vertical direction so as to allow three-dimensional movement of the riding heat sink 126 relative to the guides 116.

In some embodiments, the supports 130 may further include notches 136 formed therein configured to engage the riding heat sink 126 and the actuating assembly 128 as will be described below.

The module-contacting surface 132 may be a substantially flat and substantially smooth thermally-conductive surface formed on a bottom of the riding heat sink 126 (e.g., so as to face the socket 114) and may be configured to contact the pluggable module 103 such that a thermal interface is formed between the pluggable module 103 and the riding heat sink 126 and such that the riding heat sink 126 rides on the pluggable module 103 as will be described below. The module-contacting surface 132 may be configured so that the module-contacting surface 132, the guides 116, and the socket 114 cooperate with one another to define a module-receiving space 138 (FIG. 2). When the riding heat sink 126 is in the deployed position, the module contacting-surface 132 is spaced a first distance from the guides 116 and/or the module-receiving space 138, and when the riding heat sink 126 is in the stowed position the module-contacting surface 132 is spaced a second distance from the guides 116 and/or the module-receiving space 138, with the first distance being less than the second distance in some embodiments.

Referring back to FIG. 2, the actuating assembly 128 may include a lever 140, a biasing spring 142, and one or more clamping springs 143 (FIG. 6) in some embodiments. The actuating assembly 128 may be associated with the base 110 in any desired manner and may be operably coupled with the riding heat sink 126. The actuating assembly 128 may be configured to move the riding heat sink 126 relative to the base 110 between the deployed position and the stowed position.

The lever 140 may include a handle portion 144, a fulcrum portion 145, and protrusions 146. The fulcrum portion 145 of the lever 140 may be rotatably or pivotally associated with the base 110 by being at least partially positioned in the fulcrum notches 125 of the guides 116, so that the handle portion 144 extends past the socket 114 and so that the protrusions 146 engage the notches 136 of the supports 130. The handle portion 144 may be configured so that the handle portion 144 extends across the entrance of the socket 114 or at least partially obstructs the entrance of the socket 114 when the riding heat sink 126 is in the deployed position and so that the handle portion 144 substantially clears the entrance of the socket 114 when the riding heat sink 126 is in the stowed position. In some embodiments, the handle portion 144 may include a fiber-optic cable notch 148 formed therein as shown in FIG. 2.

Figure 5:
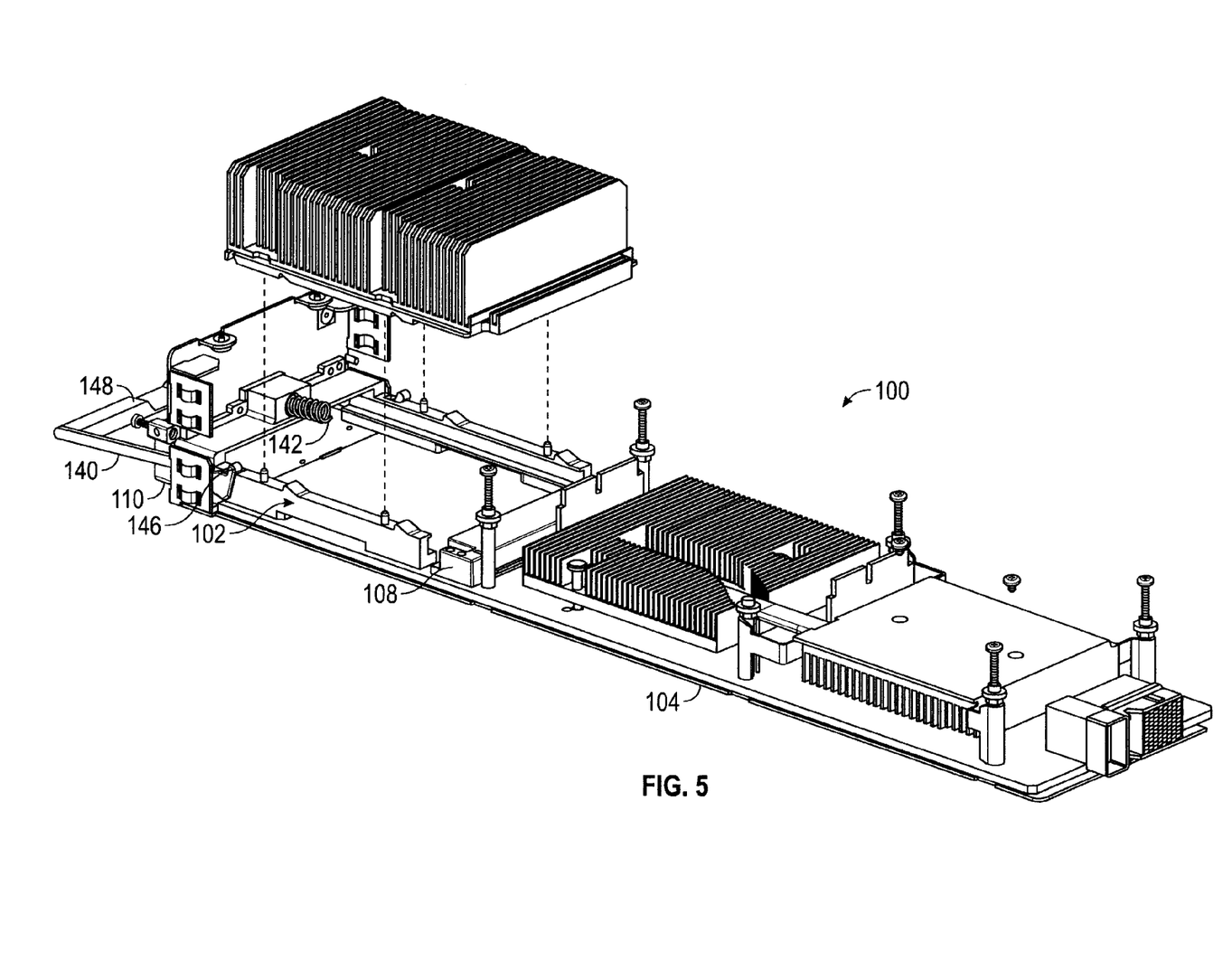
FIG. 5 is a perspective exploded view diagram of the pluggable module housing assembly of FIG. 1 with a pluggable module shown inserted therein and a cover not shown for clarity.
Figure 6:
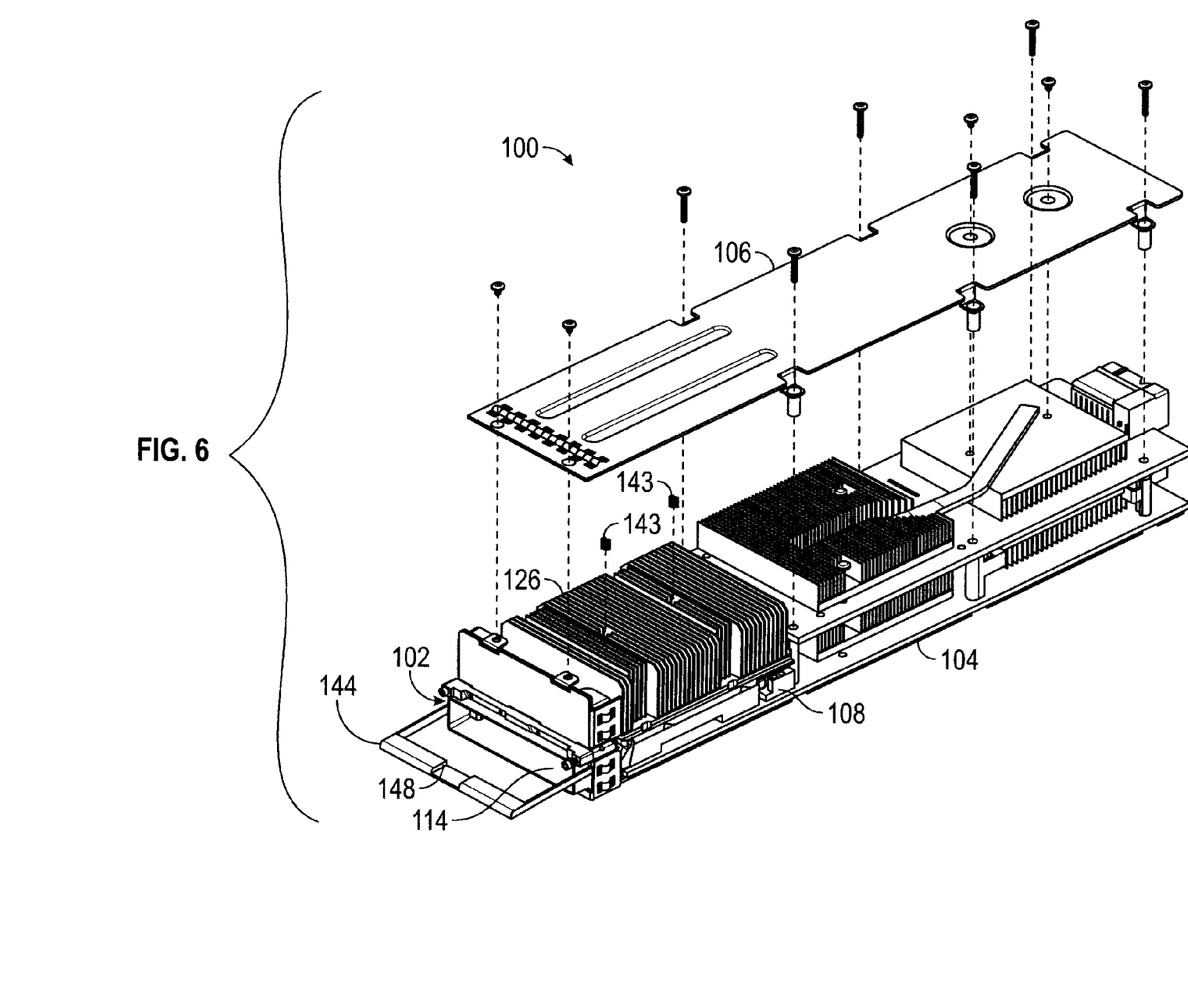
FIG. 6 is an exploded view diagram of the circuit pack of FIG. 1.

Referring now to FIGS. 5-6, the biasing spring 142 may be coupled with the base 110 and with the riding heat sink 126 and may be configured to bias the riding heat sink 126 in the deployed position (e.g., by biasing the riding heat sink 126 in a substantially lateral direction relative to the guides 116). In some embodiments, the force exerted on the riding heat sink 126 by the biasing spring 142 may be adjustable such as via one or more adjustment screws or bolts, for example. It is to be understood that in some embodiments, the biasing spring 142 may bias the riding heat sink 126 in the stowed position, while in some embodiments the biasing spring 142 may be omitted.

The clamping springs 143 (FIG. 6) may be coupled with the cover 106 and with the riding heat sink 126 and may be configured to and to adjust the clamping force between the riding heat sink 126 and a pluggable module inserted in the module-receiving space 138, for example, by biasing the riding heat sink 126 towards the guides 116 in a substantially vertical direction when the cover 106 is associated with the base 104. In some embodiments, the force exerted on the riding heat sink 126 by the clamping springs 143 may be adjustable, such as via one or more adjustment screws or bolts, for example. Any desired number of clamping springs 143 may be implemented with the inventive concepts disclosed herein. Further, in some embodiments the claiming springs 143 may be omitted, and any desired mechanism may be implemented to exert a clamping force on the riding heat sink 126, such as fasteners, actuators, clamps, brackets, elastomeric flanges or supports, or combinations thereof, for example.

Figure 7:
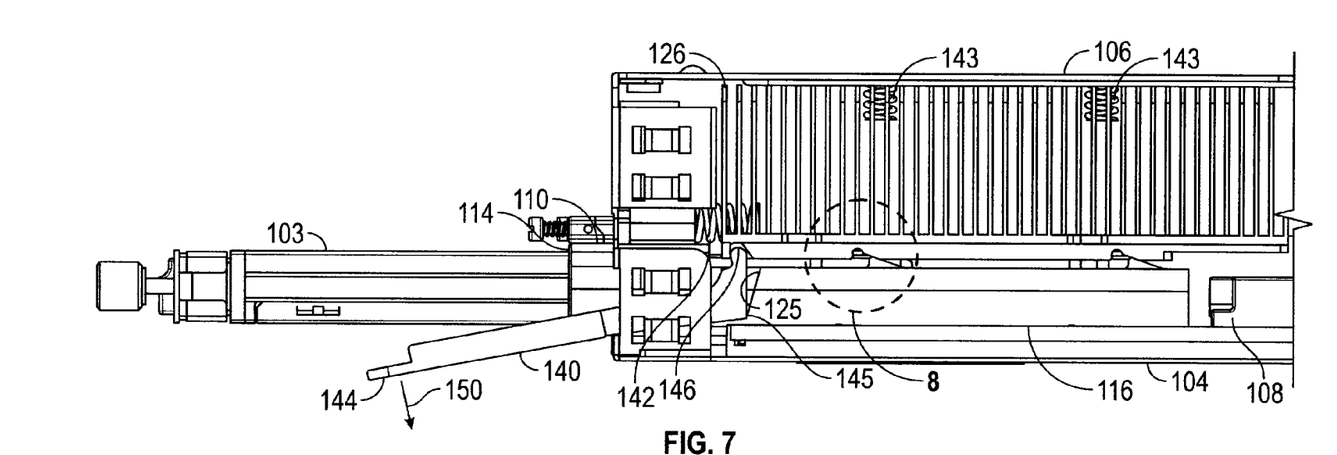
FIG. 7 is a partial side view diagram of the circuit pack of FIG. 1 showing the pluggable module housing with the riding heat sink in a stowed position according to an embodiment of the inventive concepts disclosed herein.
Figure 8:
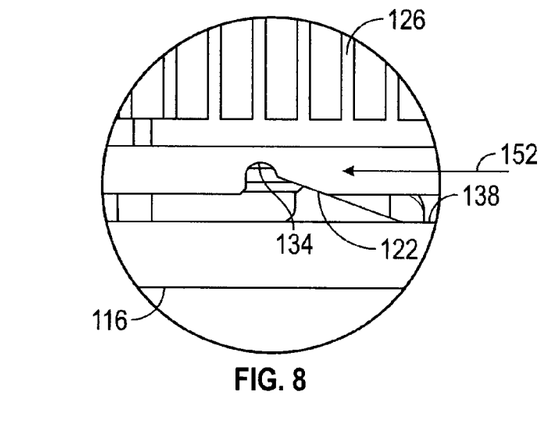
FIG. 8 is a magnified side view within a circle labeled "8" of FIG. 7.

Referring now to FIGS. 7-8, the operation of the pluggable module housing assembly 102 may proceed as follows. To install the pluggable module 103, a user may operate the handle portion 144 of the lever 140 so as to rotate the lever 140 (e.g., downward or upward) as indicated by the arrow 150 in FIG. 7, until the lever 140 rotates to a predetermined angle (e.g., about 15°) so that the handle portion 144 no longer obstructs the entrance of the socket 114. As the lever 140 rotates, the protrusions 146 engage the notches 136 and pull the riding heat sink 126 forward (e.g. laterally along the guides 116 towards the socket 114) as indicated by arrow 152 in FIG. 8. As the riding heat sink 126 moves laterally relative to the guides 116, the ramp notches 134 of the riding heat sink slide vertically up and over the ramp portions 122 of the guides 116. When the lever 140 is fully rotated so that the riding heat sink 126 is in the stowed position, the riding heat sink 126 may be raised at a total distance of about 0.027 inches above guide 116 such that the module-contacting surface 132 is raised at a distance above the module-receiving space 138.

Figure 9:
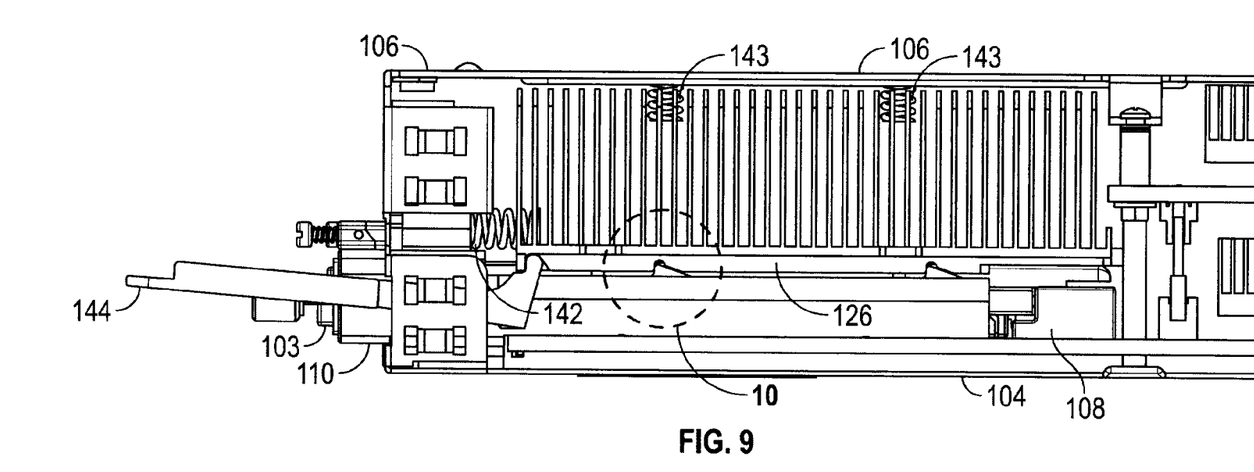
FIG. 9 is a partial side view diagram of the circuit pack of FIG. 1 showing the pluggable module housing with the riding heat sink in a deployed position according to an embodiment of the inventive concepts disclosed herein.
Figure 10:
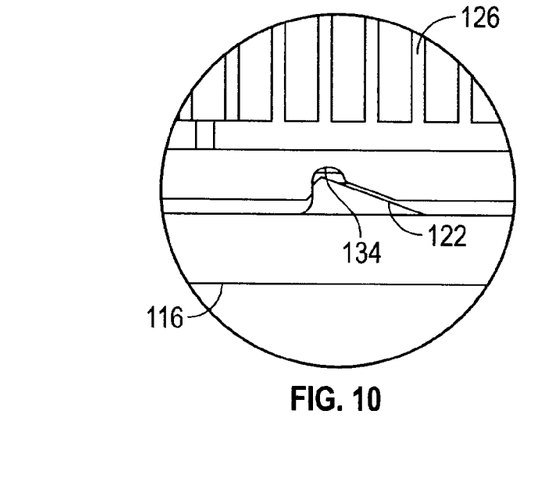
FIG. 10 is a magnified side view within a circle labeled "10" of FIG. 9.

Referring now to FIGS. 9-10, once the pluggable module 103 is fully inserted or seated in the module-receiving space 138 (e.g., such that the pluggable module 103 connects with the pluggable module connector 108), the user may release the handle portion 144 of the lever 140. The biasing spring 142 and/or the clamping springs 143 may bias the riding heat sink 126 toward the deployed position (e.g., back down the ramp portions 122), and may compress the riding heat sink 126 against the pluggable module 103, such that a thermal interface is formed between the riding heat sink 126 and the pluggable module 103.

As will be appreciated by persons of ordinary skill in the art having the benefit of the instant disclosure, by using a pluggable module housing assembly such as the pluggable module housing assembly 102, it is possible to increase the total clamping force between the riding heat sink 126 and the pluggable module 103 inserted into the module-receiving space 138 without violating the 18 pounds maximum allowable insertion force standard. Further, since the riding heat sink 126 does not contacts the pluggable module 103 during insertion, scratching and gouging on the surfaces of the pluggable module 103 and the riding heat sink 126 are avoided.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A pluggable module housing assembly, comprising:
    a base at least partially surrounding a socket having an entrance sized and dimensioned to receive a pluggable module;
    at least one guide extending adjacent to the socket;
    a heat sink assembly including:
    a riding heat sink having a module-contacting surface facing the socket; and
    an actuating assembly coupled to the base and to the riding heat sink, the actuating assembly moving the riding heat sink relative to the base between a deployed position a first distance from the at least one guide, and a stowed position a second distance from the at least one guide, the second distance being greater than the first distance,
    wherein the actuating assembly comprises a lever having a first portion movably connected to the base and a second portion engaging the riding heat sink such that movement of the lever causes movement of the riding heat sink between the deployed position and the stowed position, wherein the lever is positioned to at least partially obstruct the entrance of the socket when the riding heat sink is in the deployed position and to clear the entrance of the socket when the riding heat sink is in the stowed position, and wherein the lever has a third portion extending across the entrance of the socket when the riding heat sink is in the deployed position, the third portion having a notch sized to receive a fiber-optic cable.

2. The pluggable module housing assembly of claim 1, wherein the at least one guide is a first guide, further comprising a second guide extending adjacent to the socket, the second guide spaced a distance from the first guide and oriented substantially parallel to the first guide.

3. The pluggable module housing assembly of claim 1, wherein the heat sink assembly further comprises at least one spring coupled with the riding heat sink and with the base so as to bias the riding heat sink in the deployed position.

4. The pluggable module housing of claim 1, wherein the base includes a first side and a second side, and wherein at least one of the first side and the second side is formed as a unitary component with the at least one guide.

5. The pluggable module housing of claim 1, wherein the at least one guide includes at least one ramp portion, and the riding heat sink includes at least one corresponding notch configured to receive the at least one ramp portion when the riding heat sink is in the deployed position.

6. A circuit pack, comprising:
a support;
a pluggable module housing assembly coupled with the support and comprising:
a base at least partially surrounding a socket having an entrance sized and dimensioned to receive a pluggable module;
at least one guide extending adjacent to the socket;
a heat sink assembly including:
a riding heat sink having a module-contacting surface facing the socket; and
an actuating assembly coupled to the base and to the riding heat sink, the actuating assembly moving the riding heat sink relative to the base between a deployed position a first distance from the at least one guide, and a stowed position a second distance from the at least one guide, the second distance being greater than the first distance, wherein the actuating assembly comprises a lever having a first portion movably connected to the base and a second portion engaging the riding heat sink such that movement of the lever causes movement of the riding heat sink between the deployed position and the stowed position, wherein the lever is positioned to at least partially obstruct the entrance of the socket when the riding heat sink is in the deployed position and to clear the entrance of the socket when the riding heat sink is in the stowed position, wherein the lever has a third portion extending across the entrance of the socket when the riding heat sink is in the deployed position, the third portion having a notch sized to receive a fiber-optic cable.

7. The circuit pack of claim 6, wherein the at least one guide is a first guide, further comprising a second guide extending adjacent to the socket, the second guide spaced a distance from the first guide and oriented substantially parallel to the first guide.

8. The circuit pack of claim 6, wherein the heat sink assembly further comprises at least one spring coupled with the riding heat sink and with the base, so as to bias the riding heat sink in the deployed position.

9. The circuit pack of claim 6, wherein the base includes a first side and a second side, and wherein at least one of the first side and the second side is formed as a unitary component with the at least one guide.

10. The circuit pack of claim 6, wherein the at least one guide includes at least one ramp portion, and the riding heat sink includes at least one corresponding notch configured to receive the at least one ramp portion when the riding heat sink is in the deployed position.

11. The circuit pack of claim 6, further comprising a cover coupled with the base, and wherein the heat sink assembly further comprises at least one clamping spring coupled with the riding heat sink and with the cover, so as to bias the riding heat sink toward the at least one guide when the riding heat sink is in the deployed position.

\* \* \* \* \*